United States Patent [19]

Sangster

[11] 3,740,577

[45] June 19, 1973

[54] CAPACITIVE STORE SHIFT REGISTER

[75] Inventor: Frederik Leonard Johan Sangster, Emmasingel, Eindhoven, Netherlands

[73] Assignee: U.S. Philips Corporation, New York, N.Y.

[22] Filed: Feb. 2, 1970

[21] Appl. No.: 7,524

[30] Foreign Application Priority Data

Feb. 4, 1969 Netherlands ....................... 6901778

[52] U.S. Cl. ............ 307/221 D, 307/246, 307/293, 320/1, 333/29, 340/173 CA

[51] Int. Cl.. H03k 17/60, G11c 11/24, G11c 19/00

[58] Field of Search .................. 307/110, 293, 221, 307/221 D, 246; 320/1; 333/29; 340/173 CA; 328/37

[56] References Cited

UNITED STATES PATENTS

| | | | |
|---|---|---|---|
| 3,546,490 | 12/1970 | Sangster | 320/1 |
| 3,111,594 | 11/1963 | Stolte | 307/110 |
| 3,175,195 | 3/1965 | Fluhr | 340/173 CA |

FOREIGN PATENTS OR APPLICATIONS

| | | | |
|---|---|---|---|
| 1,922,761 | 2/1970 | Germany | 340/173 CA |
| 953,517 | 3/1964 | Great Britain | 340/173 CA |

*Primary Examiner*—Bernard Konick
*Assistant Examiner*—Stuart Hecker
*Attorney*—Frank R. Trifari

[57] ABSTRACT

A capacitive store comprising a sequence of capacitors and transistors, in which the capacitors are connected in series with the main current paths of the transistors in order to reduce the distortion of the signal to be handled and to increase the frequency range in which the store can be used.

3 Claims, 3 Drawing Figures

Figure 1:
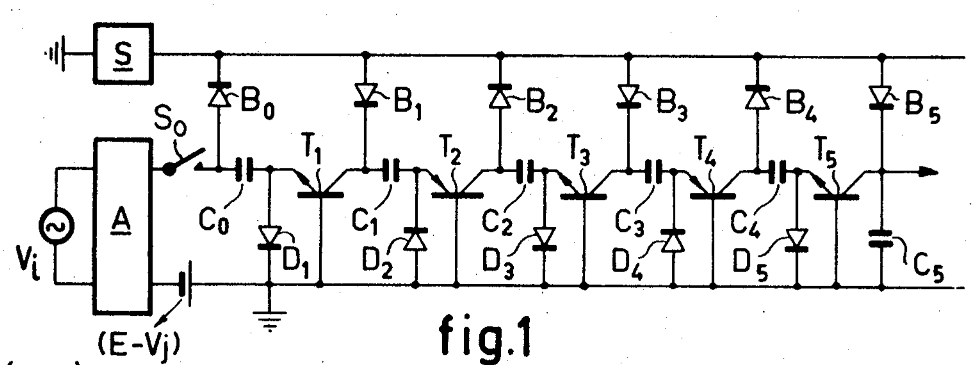

INVENTOR.
HENDRIK L.J. SANGSTER

BY

AGENT

Patented June 19, 1973 3,740,577

2 Sheets-Sheet 2

CAPACITIVE STORE SHIFT REGISTER

The invention relates to a capacitive store comprising a sequence of capacitors and transistors. Capacitive stores are often used as delay lines, for example, for audio-frequency or video-frequency signals. For this purpose the information transfer between two of the store capacitors must be as free from distortion as is possible. In a known store the capacitors are connected in series with the base collector paths of the transistors. The emitter and the base of each transistor are connected to earth through an emitter resistor and a base resistor respectively, the base of each transistor being also connected to earth through a semiconductor diode. The collector of each transistor is connected to a switching voltage source through an electronic switch.

For satisfactory operation of the known store the current gain of each transistor stage must be substantially equal to 1, which implies that the quotient of the value of the base resistor divided by the value of the emitter resistor must be substantially equal to 1. If this quotient is $< 1$, the use of a large number of transistors in the sequence will give rise to considerable attenuation of the signal. If this quotient is $> 1$, the use of a large number of transistors in the sequence will cause the signal to attain its maximum before reaching the end of the sequence, which will result in heavy distortion.

Further, in the known store distortion of the signal will always occur owing to the fact that the current flowing through the emitter resistor of each transistor is a function of the base emitter threshold voltage of the respective transistor. In addition, the base emitter threshold voltage depends upon the temperature so that the distortion will also be temperature-dependent. For the said distortion to be maintained small the signal across the base resistor must have a large amplitude.

Furthermore, in the known store the capacitance of each of the store capacitors must be many times greater than the base collector capacitances of the transistors used, because otherwise cross-talk will occur with consequent serious distortion of the signal. Since the base collector capacitance generally is large, for example, 2 pF, the store capacitance must be very large, for example, 100 pF, which renders the known store unsuitable for handling high-frequency signals and for being integrated.

It is an object of the present invention to provide a capacitive store which does not show the above-mentioned disadvantages and is suitable for integration, and the invention is characterized in that the capacitors are connected in series with the main current paths of the transistors whilst the transistors alternately are of opposite conductivity types.

The capacitive store according to the invention has the advantage that the current gain of each transistor stage is not determined by the quotient of two resistance values, and in that both resistors can be dispensed with. As a result, the store can be integrated more readily and many more stages can be connected in cascade before appreciable distortion of the signal occurs.

The capacitive store according to the invention has the further advantage that to avoid cross-talk the store capacitors must be much greater than the emitter-collector capacitances of the transistors used, where the term "cross-talk" is to be understood to mean that two successive signal samples influence one another owing to the fact that the said parasitic collector-base capacitance forms a direct coupling between two successive store capacitors. Since the collector-emitter capacitance of a present-day integrated transistor is about 0.01 pF without special steps being taken, the store capacitance may now be 5 pF before appreciable distortion of the signal will occur. Consequently, the store according to the invention is suited to handle, for example, video-frequency signals.

An additional advantage of the capacitive store according to the invention is the fact that the maximum permissible amplitude of the switching signal now is determined by the collector base breakdown voltage of the transistors used ($\approx$ 60 volts), which is many times higher than the emitter base breakdown voltage ($\approx$ 6 volts). Hence, the capacitive store according to the invention is highly suited to handle audio-frequency signals, for which use the signal-to-noise ratio has to satisfy exacting requirements (for example, to be 70dB), for the signal-to-noise ratio is about proportional to $\sqrt{(C \cdot E/n}$, where $C$ is the value of the store capacitance, $E$ is the maximum permissible amplitude of the switching signal and $n$ is the number of store capacitors used. Thus, increasing of the maximum permissible amplitude $E$ of the switching signal by a factor of 10 provides a signal-to-noise ratio which is better by $\sqrt{10} = 10$ dB.

Figure 2:
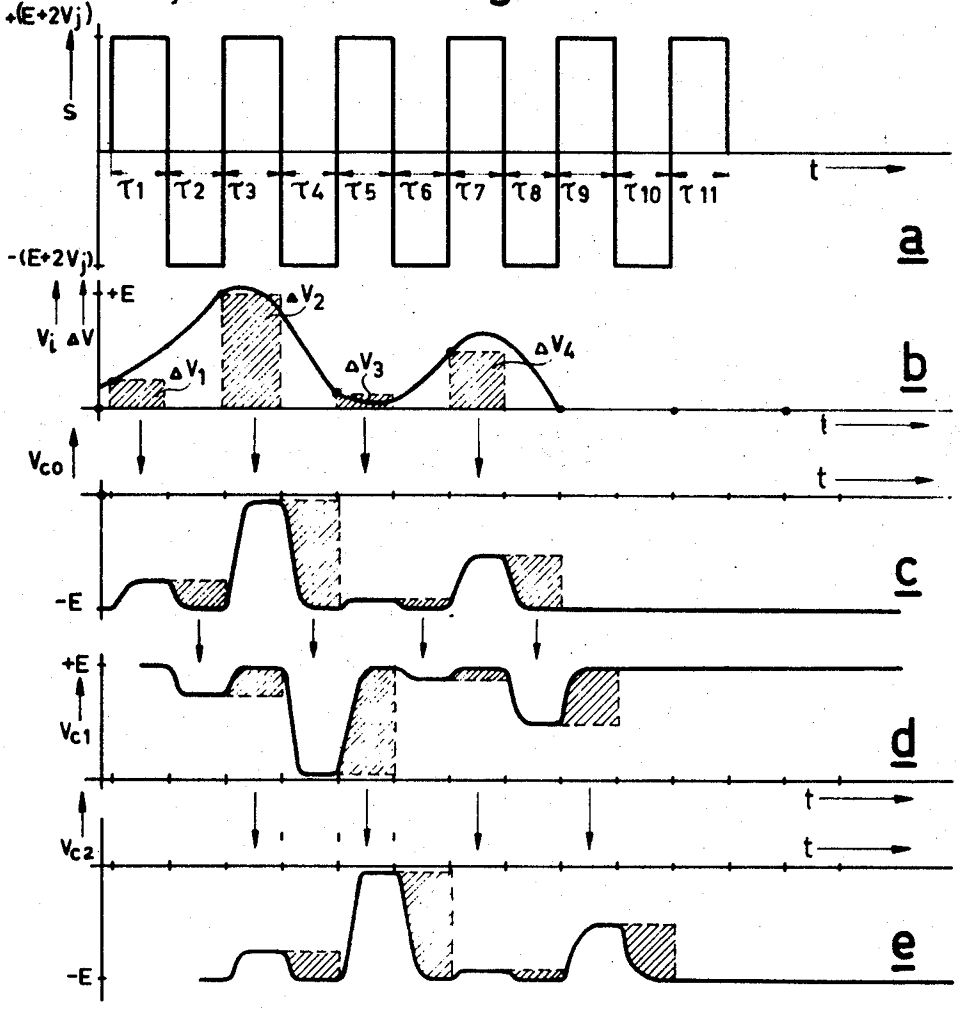
Figure 3:
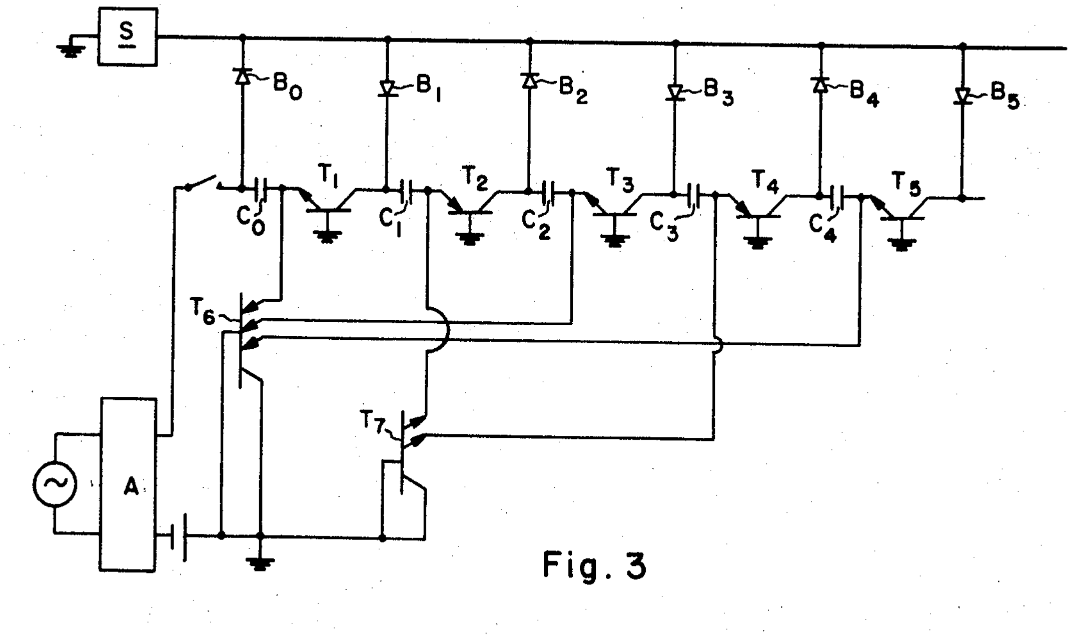

An embodiment of the invention will now be described, by way of example, with reference to the accompanying diagrammatic drawing, in which:

FIG. 1 is the circuit diagramm of a capacitive store according to the invention, FIG. 2 shows the voltage wave-forms which occur at various points of this store, and FIG. 3 is the circuit diagram of a capacitive store according to another embodiment of the invention.

Referring now to FIG. 1, store capacitors $C_0$ to $C_n$ are connected in series with the main current paths of transistors $T_1$ to $T_n$. The transistors $T_1$ to $T_n$ alternately are of opposite conductivity types. It should be noted that in bipolar transistors the main current path is defined as the emitter collector path, while in field-effect transistors the main current path is defined as the path between the source and the drain. The bases of the transistors $T_1$ to $T_n$ are jointly connected to a point of constant potential. Between the base and the emitter of each transistor $T_x$ ($x = 1, ...,n$) there is connected a semiconductor diode $D_x$ ($x = 1,...,n$) which is of a conductivity type opposite to that of the transistor $T_x$ ($x = 1,...,n$). The collector of each transistor $T_x$ is connected to a switching-voltage source S through a semiconductor diode $B_x$ ($x = 1,...,n$) of the same conductivity type as the afore-mentioned diode $D_x$. The first store capacitor $C_0$ has its terminal more remote from the emitter of the transistor $T_1$ connected through a semiconductor diode $B_0$ to the switching-voltage source S and also through a sampling circuit A to a signal voltage source $V_i$.

The operation of the capacitive store will now be described more fully with reference to FIG. 2. In FIG. 2*a* the output switching voltage of the switching voltage source is plotted as a function of time. The amplitude of the switching voltage is made equal to ($E + 2V_j$) volts, where $V_j$ is equal to the voltage drop each of the diodes $D_x$ and $B_x$ ($x = 1,...,n$) in their conductive states and to the base-emitter threshold voltage of the transistors used. In FIG. 2*b* the input signal $V_i$ is plotted as a function of time, and this Figure also shows signal samples $\Delta V_1$, $\Delta V_2$, $\Delta V_3$ and $\Delta V_4$ which the sampling circuit A delivers in time intervals $\pi_1$, $\pi_3$, $\pi_5$ and $\pi_7$ respectively, see the hatched blocks. In the time interval $\pi_1$ the switching-voltage source S delivers a voltage which is equal to $(E + 2V_j)$ volts. As a result, the transistor $T_1$, and the diode $B_o$ are cut off. In this time interval the switch $S_o$ is closed. The output signal of the sampling circuit A is equal to $\Delta V_1$ volt in this time interval, see FIG. 2*b*. The voltage between that terminal of the capacitor $C_o$ which is connected to the diode $B_o$ and earth will be equal to $-(E-V_j) + \Delta V_1$ volts. Current will flow through the capacitor $C_o$ and the diode $D_1$ until the voltage across the capacitor $C_o$ has become equal to $-(E - \Delta V_1)$ volts, because then the voltage across the diode $D_1$ becomes equal to $V_j$ volts and the diode $D_1$ becomes unconductive. During the same time interval $\pi_1$ the transistor $T_2$ and the diode $B_1$ will be conductive so that current will flow through the diode $B_1$ and the capacitor $C_1$. This current will flow until the voltage across the base-emitterpath of the transistor $T_1$ has become equal to $V_j$, the threshold voltage. This means, that when the voltage across the capacitor $C_1$ is equal to $+E$ volt, the transistor $T_1$ shall be cut off. Thus in the time interval $\pi_1$ the information $\Delta V_1$ has been transferred to the capacitor $C_o$; the voltage across this capacitor is increased by $\Delta V_1$ volt with respect to its reference voltage of $-E$ volt, see FIG. 2*c*. In the same time interval the voltage across the capacitor is made equal to its reference voltage of $+E$ volts, see FIG. 2*d*.

In the time interval $\pi_2$ the switching-voltage source S delivers a voltage which is equal to $-(E + 2V_j)$ volts. As a result, the diodes $D_2$ and $B_0$ and the transistor $T_1$ will become conductive. Current will flow through diode $D_2$, capacitor $C_1$, transistor $T_1$, capacitor $C_0$ and diode $B_0$. This current will flow until the voltage across the capacitor $C_0$ has become equal to $-E$ volts. When the capacitors $C_0$ and $C_1$ have equal capacitive values, the voltage across the capacitor $C_1$ will drop by $\Delta V_1$, see FIG. 2*d*. Thus, in the time interval $\pi_2$ the information $\Delta V_1$ has been shifted to the capacitor $C_1$. In the same time interval $\pi_2$ the transistor $T_1$ and the diodes $B_2$ and $D_4$ will be conductive, so that current will flow through diode $D_4$, capacitor $C_3$, transistor $T_3$. capacitor $C_2$ and diode $B_2$ until the voltage across the capacitor $C_2$ has become equal to $-E$ volts.

In the time interval $\pi_3$ the switching-voltage source S delivers a voltage which is equal to $+(E + 2V_j)$ volts. As a result, the diodes $B_1$ and $D_3$ and the transistor $T_2$ will become conductive. Current will flow through diode $B_1$, capacitor $C_1$, transistor $T_2$, capacitor $C_2$ and diode $D_3$ until the voltage across the capacitor $C_1$ has become equal to $+E$ volts. When the capacitors $C_1$ and $C_2$ have equal capacitive values, the voltage across the capacitor $C_2$ will be increased by $\Delta V_1$. In the time interval $\pi_1$ the formation $\Delta V_1$ is shifted to the capacitor $C_2$. A similar transfer applies to the signal samples $\Delta V_2$, $\Delta V_3$ and $\Delta V_4$.

The even-numbered diodes $D_2$, $D_4$,... shown in FIG. 1 may be replaced by as many base emitter diodes of a *p-n-p* multi-emitter transistor. The odd-numbered diodes $D_1$, $D_3$,... may be replaced by as many base emitter diodes of an *n-p-n* multi-emitter transistor.

It will be appreciated that the invention is not restricted to the embodiment given and that for one skilled in the art many variations are possible within the scope of the invention. Thus, both bipolar transistors and field-effect transistors may be used. Further, both field-effect transistors having an *n*-type and *p*-type channel region and field-effect transistors of the enhancement and depletion types may be used. Furthermore, the circuit arrangement shown in FIG. 1 may be used to advantage as a filter for electric signals. Also, conventional input and output circuits may be used in conjunction with the circuit arrangement shown in FIG. 1. Further two or more circuit arrangements as shown in FIG. 1 may be connected in parallel with common input or inputs and/or common output or outputs.

What is claimed is:

1. A capacitor store, comprising a first plurality of transistors of a first conductivity type each having a main conduction path, a second plurality of transistors of an opposite conductivity type each having a main conduction path, means for connecting the main conduction paths of all the transistors of both conductivity types in a series circuit wherein the transistors are alternately of opposite conductivity types, and wherein a capacitor is connected between each transistor of the series and an adjacent transistor in series with the main conduction paths of the associated transistors, and means for connecting switching voltages to the main conduction paths of each of the transistors in the series through an associated capacitor of the series.

2. A capacitor store as claimed in claim 1, wherein each transistor of the series comprises a control input, wherein the current through the main conduction path of each transistor varies as a function of the voltage between the control input and one end of the main conduction path thereof, further comprising a first plurality of diodes, each connected in parallel with an associated transistor between the control input and the one end of the main conduction path, each diode of the first plurality of diodes having a polarity wherein normal conduction through the main conduction path of an associated transistor passes through an associated diode in the low resistance direction thereof, a second plurality of diodes comprising the means for connecting the switching voltages to each capacitor.

3. A capacitor store as claimed in claim 2, wherein each transistor of both conductivity types has an emitter and a collector, wherein each of the second plurality of diodes is connected to a separate collector of each transistor in the series, wherein the diodes of the first plurality of diodes are base-emitter diodes ot two multi-emitter transistors, and whereby each multi-emitter transistor is of the same conductivity type as the collector of the transistor to which it is connected.

* * * * *

PO-1050
(5/69)

UNITED STATES PATENT OFFICE
CERTIFICATE OF CORRECTION

Patent No. 3,740,577 Dated June 19, 1973

Inventor(s) FREDERIK LEONARD JOHAN SANGSTER

It is certified that error appears in the above-identified patent and that said Letters Patent are hereby corrected as shown below:

Col. 2, line 63, after "drop" should be --across--;

Col. 3, line 1, all four (4) occurences "$\pi$" should be --$\tau$--;

line 3, "$\pi$" should be --$\tau$--;

line 16, "$\pi$" should be --$\tau$--;

line 23, "$\pi$" should be --$\tau$--;

line 29, "$\pi$" should be --$\tau$--;

line 38, "$\pi$" should be --$\tau$--;

line 40, "$\pi$" should be --$\tau$--;

line 45, "$\pi$" should be --$\tau$--;

line 54, "$\pi$" should be --$\tau$--;

IN THE CLAIMS

Claim 3, line 6, "ot" should be --of--;

Signed and sealed this 25th day of December 1973.

(SEAL)
Attest:

EDWARD M.FLETCHER,JR.
Attesting Officer

RENE D. TEGTMEYER
Acting Commissioner of Patents